United States Patent [19]

Hatauchi et al.

[11] Patent Number: 5,548,482
[45] Date of Patent: Aug. 20, 1996

[54] SEMICONDUCTOR INTEGRATED CIRCUIT APPARATUS INCLUDING CLAMPED HEAT SINK

[75] Inventors: Kazushi Hatauchi; Haruo Shimamoto, both of Kikuchi-gun, Japan

[73] Assignee: Mitsubishi Denki Kabushiki Kaisha, Tokyo, Japan

[21] Appl. No.: 466,929

[22] Filed: Jun. 6, 1995

[30] Foreign Application Priority Data

Aug. 26, 1994 [JP] Japan .................................. 6-202335

[51] Int. Cl.⁶ .................................................. H05K 7/20
[52] U.S. Cl. .................. 361/720; 257/707; 257/713; 257/719; 257/726; 257/727; 361/704; 361/715; 361/718
[58] Field of Search ................................. 165/80.2, 80.3, 165/185; 174/16.3; 257/707, 712–713, 718–719, 728, 727; 361/688, 690, 704, 707, 709–711, 717–722, 807, 809–810

[56] References Cited

FOREIGN PATENT DOCUMENTS

| 3208251 | 8/1988 | Japan | 361/718 |
| 582688 | 9/1991 | Japan . | |
| 5243439 | 3/1992 | Japan . | |
| 4352391 | 12/1992 | Japan | 361/720 |

*Primary Examiner*—Gregory D. Thompson
*Attorney, Agent, or Firm*—Leydig, Voit & Mayer

[57] ABSTRACT

The present invention provides a semiconductor integrated circuit apparatus with a heat sink that can be changed in size, that accommodates a board and electronic parts having different sizes, and that increases heat radiation. The present invention includes a cooling member facing and connected to electronic parts via a thermally conductive resin or thermally conductive fat and fatty oil and at least two thermally conductive clamps that are soldered to a board and that support portions of the perimeter of the cooling member.

2 Claims, 4 Drawing Sheets

5,548,482

SEMICONDUCTOR INTEGRATED CIRCUIT APPARATUS INCLUDING CLAMPED HEAT SINK

BACKGROUND OF THE INVENTION

1. Field of the Invention

The present invention relates to improvement of a semiconductor integrated circuit apparatus having electronic parts such as semiconductor integrated circuit devices and a cooling apparatus for the electronic parts on a board.

2. Description of the Related Art

FIG. 11 is a cross-sectional view showing an example of a conventional semiconductor integrated circuit apparatus having an electronic part such as a semiconductor integrated circuit device and a cooling apparatus for the electronic part on a board. As shown in FIG. 11, heretofore, when a cooling member such as a heat sink fin 3 is attached to an electronic part 1 mounted on a board 2, an adhesive 8 is used for bonding. However, this method has a possibility that, if the heat sink fin 3 is detached from the electronic part 1, both parts may be broken. In addition, if the heat sink fin 3 is fixed on the board with screws (for example, Japanese Patent Laid-Open No. 5-243439), it is possible to detach the heat sink fin 3 from the electronic part 1 without damage by removing these screws. However, in case of using screws, tapped holes should be prepared in the board 2, and consequently this causes a problem that parts mounting density on the board is reduced by these tapped holes.

In order to solve these problems, recently, a constitution has been proposed in which a heat sink fin is attached through thermally-conductive fats and fatty oils such as a thermally-conductive grease or a thermally-conductive resin on the upper face of a semiconductor package, and this heat sink fin is compressed with springs that are attached under a fixed plate fixed on the board (for example, Japanese Patent Laid-Open No. 5-82688).

However, in the conventional semiconductor integrated circuit apparatus as described above, since a fixed plate supports a heat sink fin from four directions and an upper direction, a fixed plate can be used only for a heat sink fin having a size corresponding to the fixed plate. In general, the sizes of electronic parts such as a semiconductor package and heat sink fin corresponding to it, in particular, the sizes in the direction parallel to a board are various. Therefore, this causes problems that, if a heat sink fin is changed to a new one in different size, there may be no fixed plate suitable to the new heat sink fin, and, even if the suitable fixed plate is available, time is wasted in searching for and exchanging plates.

In addition, there are electronic parts and heat sink fins of various sizes not only parallel to but also perpendicular to a board. However, in a conventional semiconductor integrated circuit apparatus, it is very difficult flexibly to respond to size changes of electronic parts in the these directions.

Further, in a conventional semiconductor integrated circuit apparatus, it is difficult to radiate sufficient heat from electronic parts efficiently.

Furthermore, in conventional semiconductor integrated circuit apparatus, it is not possible sufficiently to respond to a plurality of electronic parts having significantly different heights, with one cooling member.

SUMMARY OF THE INVENTION

The present invention is intended as a solution to the aforesaid problems. The first object of the present invention is to provide a semiconductor integrated circuit apparatus having a cooling apparatus for electronic parts that can accommodate a change in a cooling member to a different size in a direction parallel to a board.

In addition, the second object is to provide a semiconductor integrated circuit apparatus having a cooling apparatus for electronic parts that can accommodate a change of a cooling member to a member having a different size in directions parallel and perpendicular to a board.

Further, the third object is to provide a semiconductor integrated circuit apparatus having a cooling apparatus for electronic parts that can increase heat radiation capability for the electronic parts.

Furthermore, the fourth object is to provide a semiconductor integrated circuit apparatus having a cooling apparatus for electronic parts that can sufficiently correspond to a plurality of electronic parts, whose heights are significantly different from each other, with one cooling member.

A semiconductor integrated circuit apparatus according to the present invention has electronic parts, such as semiconductor integrated circuit devices, and a cooling apparatus for the electronic parts on a board, the semiconductor integrated circuit apparatus including: a cooling member facing upper faces of the electronic parts through a thermally-conductive resin or thermally-conductive fats and fatty oils; and at least two thermally-conductive materials that are soldered on the board, and that support portions of a perimeter of the cooling member, respectively.

In a semiconductor integrated circuit apparatus having a cooling apparatus for electronic parts according to the present invention, the electronic parts and the cooling member are placed opposite to each other through a thermally-conductive resin or thermally-conductive fats and fatty oils. Therefore, unlike a conventional example, the electronic parts and the cooling member are not fixed with an adhesive. Accordingly, the cooling member can be easily detached from the electronic parts, there is no possibility of breaking the electronic parts in exchanging or inspecting them, and reclamation of the electronic parts and the cooling member becomes possible. In addition, portions of the perimeter of the above-described cooling member are supported with the above-described two thermally-conductive materials, respectively. Therefore, if the size parallel to the board of the cooling member is changed, this apparatus can flexiblly respond by changing soldered positions of the above-described thermally-conductive materials on the board.

Further, by inserting elastic members between the above-described thermally-conductive materials and the cooling member, if the heights, that is, sizes of the electronic parts in the direction perpendicular to the board are changed, the size change can be absorbed by deformation of the elastic members.

Furthermore, notches are formed in the above-described thermally-conductive materials, for moving the above-described cooling member toward a direction parallel to the board. Therefore, in case it becomes necessary to detach only the cooling member at the time of inspection or pattern revision of the board, it becomes possible to move only the cooling member through the notches for a detachment without melting the solder fixing the thermally-conductive materials to the board.

Moreover, at least one of the above-described thermally-conductive materials is soldered to a thermal via of the board. Then, since heat generated by the electronic parts is radiated not only from the cooling member but also from this thermal via through the thermally-conductive material, the heat radiation capability of the cooling apparatus can be further increased.

In addition, the above-described cooling member and a plurality of electronic parts, whose heights are different from each other, are placed opposite each other, and spacers are inserted between comparatively low electronic parts, and the cooling member. Thereby, this apparatus can sufficiently correspond to a plurality of electronic parts, different from each other, with one cooling member.

Further, the above-described cooling member and a plurality of electronic parts, having heights different from each other, are placed opposite each other. In addition, portions of the lower face of this cooling member which face the comparatively low electronic parts protrude toward those electronic parts. By means of this formation, this apparatus can sufficiently correspond to a plurality of electronic parts which have significantly different heights with one cooling member.

DETAILED DESCRIPTION OF THE PREFERRED EMBODIMENTS

EMBODIMENT 1

Figure 1:
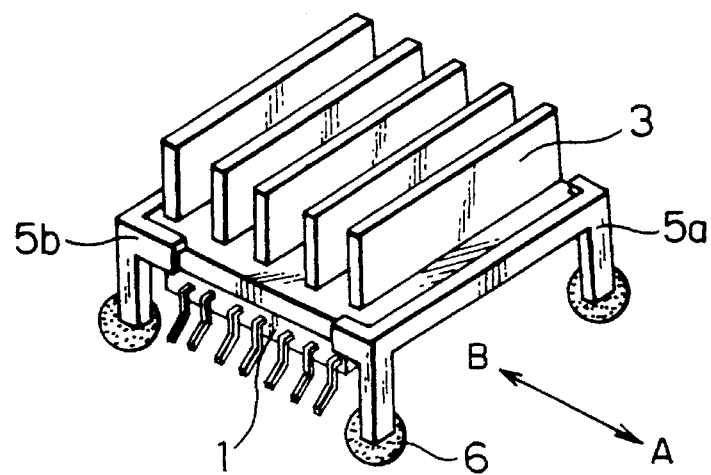
FIG. 1 is a perspective view showing a semiconductor integrated circuit apparatus according to Embodiment 1 of the present invention.
Figure 2:
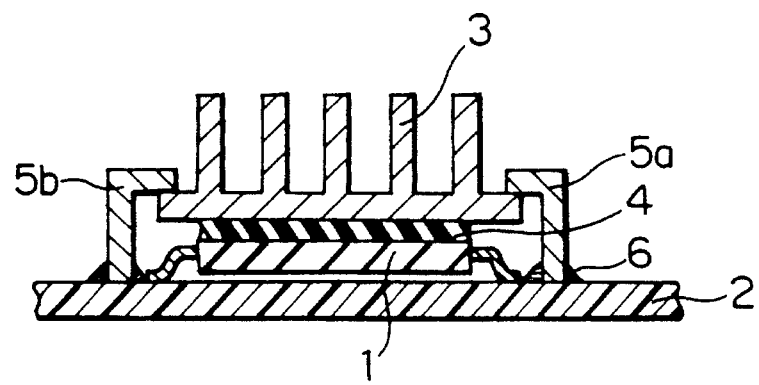
FIG. 2 is a cross-sectional view showing a semiconductor integrated circuit apparatus according to Embodiment 1 of the present invention.

Hereinafter, Embodiment 1 of the present invention will be described with reference to drawings. FIG. 1 is a perspective view showing a semiconductor integrated circuit apparatus that is an embodiment of the present invention and has a cooling apparatus for electronic parts, and FIG. 2 is a cross-sectional view. In these drawings, electronic parts such as IC's and LSI's are mounted on a board 2, and a heat sink fin 3 is attached to electronic parts 1. Between the electronic parts 1 and the heat sink fin 3, a thermally-conductive resin or thermally-conductive fats and fatty oils 4 is inserted. The reference numeral 5a shows a thermally-conductive material, i.e., clamp or hold-down, pressing down and supporting edges of four edges of the heat sink fin 3, and 5b shows another thermally-conductive material, i.e., clamp, pressing down and supporting two other edges of the heat sink fin 3. These thermally-conductive clamps materials 5a and 5b are bonded to the board 2 with solder 6.

Next, in the above embodiment, the mechanism by which the thermally-conductive clamps materials 5a and 5b press the heat sink fin 3 will be described below. First, a thermally-conductive resin or thermally-conductive fats and fatty oils 4 is applied to the upper face of the electronic parts 1, and the heat sink fin 3 is attached thereon. Subsequently, the thermally-conductive clamps 5a and 5b are placed on both sides of the heat sink fin 3 so as to press all four edges of the heat sink fin 3. Then, the feet of the thermally-conductive clamps materials 5a and 5b, that is, portions contacting to the board 2, are bonded to the board 2 with solder 6.

In this embodiment, the thermally-conductive clamps materials 5a and 5b pressing the heat sink fin 3 are bonded to the board 2 with solder 6 as described above. Therefore, it is not necessary to drill holes in the board for placing the thermally-conductive clamps, and it is easy to detach the thermally-conductive clamps 5a and 5b from the board 2 by melting the solder 6. Further, these detached thermally-conductive clamps materials 5a and 5b and the heat sink fin 3 can be used again.

In addition, in this embodiment, since the heat sink fin 3 is attached to the electronic parts 1 such as IC's, LSI's, or the like through the thermally-conductive resin or thermally-conductive fats and fatty oils 4, not with an adhesive, it is easy to detach the heat sink fin 3 from the electronic parts 1. Therefore, it is not necessary to worry about damage accompanying the separation of the electronic parts 1 and the heat sink fin 3 at the time of exchanging or inspecting the electronic parts 1.

Further, in this embodiment, the thermally-conductive resin or thermally-conductive fats and fatty oils 4 is inserted between the electronic parts 1 and the heat sink fin 3. Therefore, by coated quantity of this thermally-conductive resin or thermally-conductive fats and fatty oils 4, horizontal errors among the electronic parts 1, heat sink fin 3, and thermally-conductive materials 5a and 5b depressing the heat sink fin 3 can be absorbed.

Furthermore, in this embodiment, the thermally-conductive materials 5a and 5b urge the heat sink fin 3 to contact the heat sink fin 3, and the thermally-conductive clamps 5a and 5b serve as heat sinks with the heat sink fin 3. Hence, the heat radiation capability of the entire cooling apparatus can be increased.

Moreover, in this embodiment, so as to clamp the heat sink fin 3, two thermally-conductive materials 5a and 5b depress respectively two sides facing each other and including two edges opposite to each other among four edges of the heat sink fin 3. Since these two thermally-conductive clamps materials 5a and 5b are soldered to the board 2 so as to face each other, the distance between them can be optionally adjustable in the direction opposite to each other, that is, the direction of a arrows A–B in FIG. 1. Accordingly, in this embodiment, this apparatus can accommodate a change in that the size of the heat sink fin 3 in a direction almost parallel to the board 2 (i.e., essentially the direction of the arrows A–B).

EMBODIMENT 2

Figure 3:
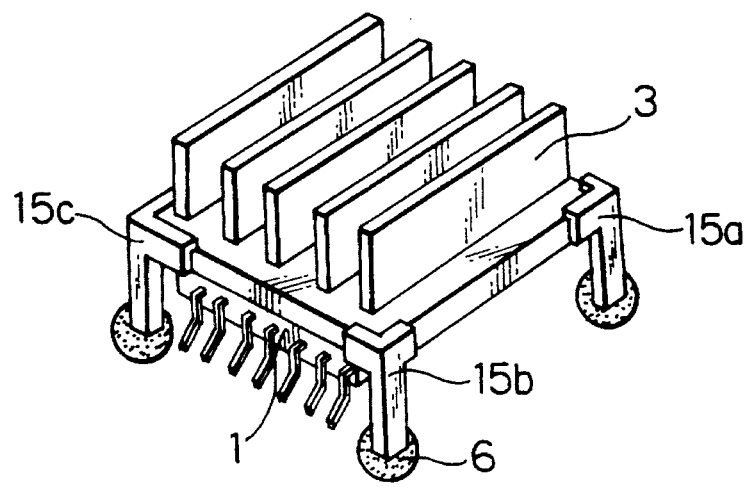
FIG. 3 is a perspective view showing a semiconductor integrated circuit apparatus according to Embodiment 2 of the present invention.

FIG. 3 shows Embodiment 2 of the present invention. In the embodiment of FIG. 3, a heat sink fin 3 is supported by four thermally-conductive materials, i.e., clamps or hold-downs, (in FIG. 3, three thermally-conductive materials shown by 15a, 15b, and 15c are illustrated). These four thermally-conductive clamps materials depress respective corners of the heat sink fin 3 and support the heat sink fin 3. Distances between these four thermally-conductive materials in the direction parallel to a board 2 can be optionally changed by changing mutual positional relations of the thermally-conductive materials. Therefore, according to this embodiment, this apparatus can accommodate a change in the size of the heat sink fin 3 in the direction parallel to the board 2 by changing mutual positional relations of the above-described four thermally-conductive clamps.

In addition, in this Embodiment 2, although four edges of the heat sink fin 3 are held down and supported by four thermally-conductive clamps, materials respectively, the present invention is not so limited. For example, four thermally-conductive materials can depress four respective sides of the heat sink fin 3. In the other aspect, four thermally-conductive materials can support only two sides facing each other of the four sides of the heat sink fin 3.

EMBODIMENT 3

Figure 4:
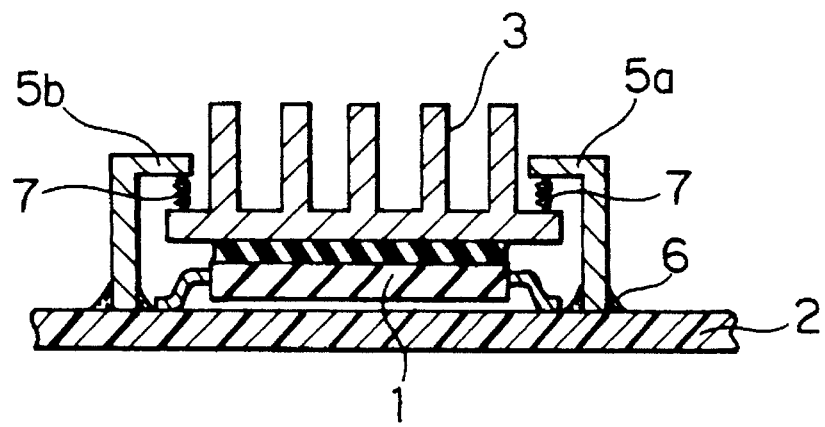
FIG. 4 is a perspective view showing a semiconductor integrated circuit apparatus according to Embodiment 3 of the present invention.

FIG. 4 shows Embodiment 3 of the present invention. In the embodiment of FIG. 4, coil springs 7 are attached to the lower faces of two thermally-conductive clamps 5a and 5b shown in FIG. 1, and depressing the heat sink fin 3, and are inserted between the heat sink fin 3 and the thermally-conductive clamps 5a and 5b. The attached positions of the coil springs 7 are lower faces of the thermally-conductive clamps 5a and 5b opposite four corners of the heat sink fin 3 or optional portions at which the coil springs can depress the heat sink fin 3.

In general, electronic parts such as IC's and LSI's have various heights, and the thicknesses of heat sink fins 3 are not constant. According to this embodiment, it is not necessary to use thermally-conductive having heights suitable to the electronic parts respectively, because the coil springs 7 attached to the thermally-conductive clamps can compensate for the height difference. In addition, because of the resilience of the coil springs 7, the coil springs can compensate for height error between the thermally-conductive clamps 5a and 5b depressing the heat sink fin 3. Further, by using thermally-conductive clamps for the coil springs 7, heat conduction from the heat sink fin 3 to the thermally-conductive can be increased, and hence the heat radiation of the entire cooling apparatus can be increased.

Furthermore, in this Embodiment 3, although coil springs 7 are attached to two thermally-conductive clamps 5a and 5b respectively, four coil springs, of course, can be attached to four thermally-conductive clamps respectively.

EMBODIMENT 4

Figure 5:
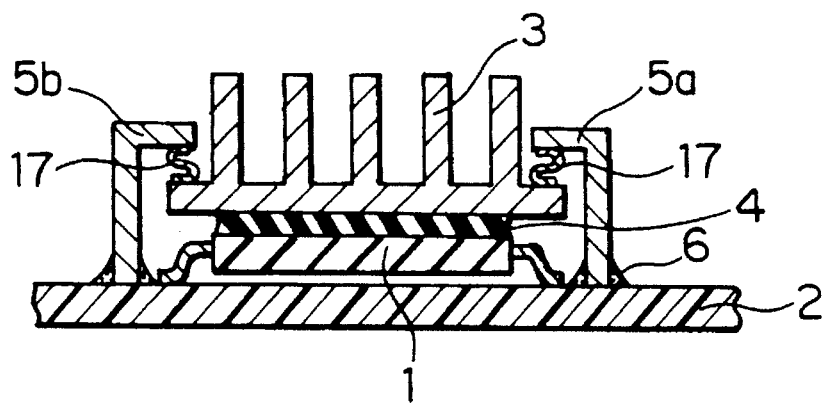
FIG. 5 is a cross-sectional view showing a semiconductor integrated circuit apparatus according to Embodiment 4 of the present invention.

FIG. 5 shows Embodiment 4 of the present invention. In the embodiment of FIG. 5, S-shaped leaf springs 17 are attached to the lower faces of two thermally-conductive clamps 5a and 5b, the portions depressing the heat sink fin 3, and are inserted between the heat sink fin 3 and the thermally-conductive clamps 5a and 5b. These leaf springs are made of good thermally-conductive clamps. Therefore, according to Embodiment 4 also, the same effects as those in Embodiment 3 as described above can be obtained.

EMBODIMENT 5

Figure 6:
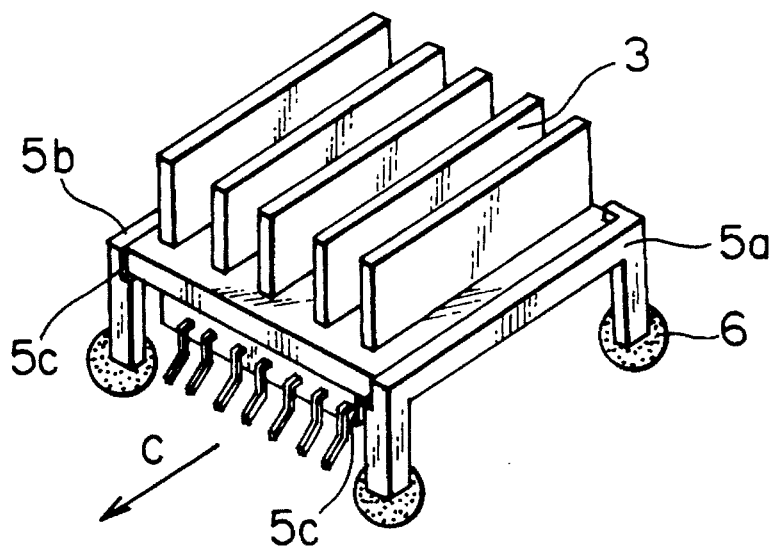
FIG. 6 is a perspective view showing a semiconductor integrated circuit apparatus according to Embodiment 5 of the present invention.

FIG. 6 shows Embodiment 5 of the present invention. In the embodiment of FIG. 6, notches 5c are formed in two edges of two thermally-conductive clamps 5a and 5b in a cooling apparatus for electronic parts shown in FIG. 1, the two edges facing each other. Owing to this formation, a heat sink fin 3 can be moved to the direction of the notches 5c (the direction of the arrow C in FIG. 6). Therefore, it becomes possible to move only the heat sink fin 3 in the direction of the arrow C independently from the electronic parts 1 and to remove the heat sink fin 3 at the time of inspecting or exchanging the heat sink fin 3.

EMBODIMENT 6

Figure 7:
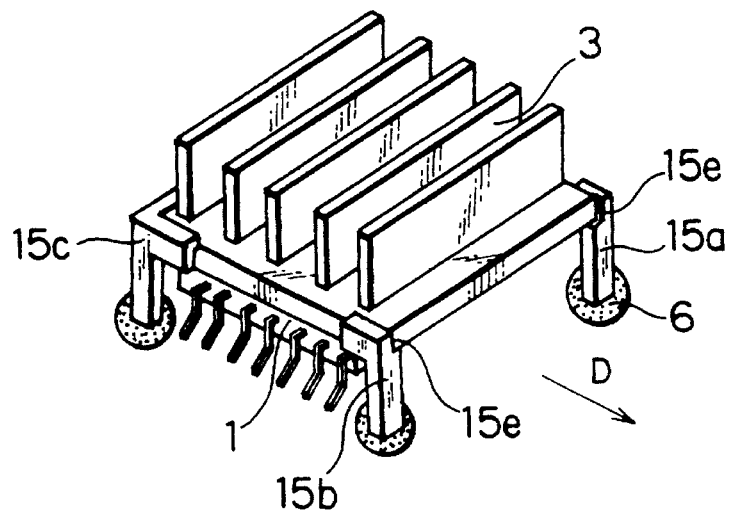
FIG. 7 is a perspective view showing a semiconductor integrated circuit apparatus according to Embodiment 6 of the present invention.

FIG. 7 shows Embodiment 6 of the present invention. In the embodiment of FIG. 7, notches 15e in two edges of two thermally-conductive clamps 15a and 15b among four thermally-conductive materials in a cooling apparatus for electronic parts shown in FIG. 3 face each other. Owing to this formation, a heat sink fin 3 can be moved in the direction of the notches 15e (the direction of the arrow D in FIG. 7). Hence, it becomes possible to move only the heat sink fin 3 in the direction of the arrow D independently from electronic parts 1 and to remove the heat sink fin 3.

EMBODIMENT 7

Figure 8:
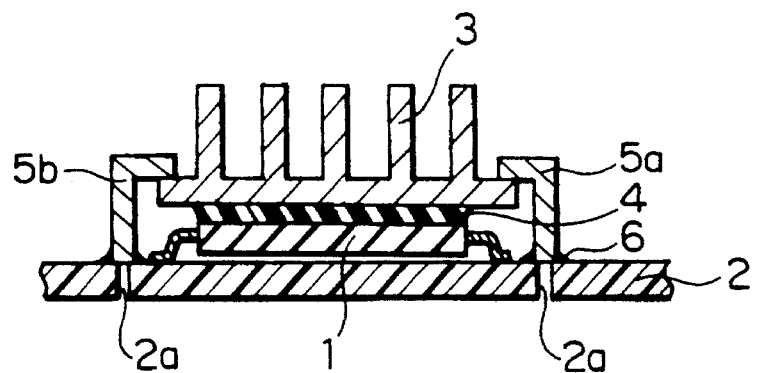
FIG. 8 is a cross-sectional view showing a semiconductor integrated circuit apparatus according to Embodiment 7 of the present invention.

FIG. 8 shows Embodiment 7 of the present invention. In the embodiment of FIG. 8, the feet of two thermally-conductive clamps 5a and 5b in a cooling apparatus for electronic parts shown in FIG. 1 are soldered on thermal vias 2a. Owing to this formation, heat from the electronic parts 1 is radiated not only from a heat sink fin 3 but also from the thermal vias 2a through the thermally-conductive clamps 5a and 5b after passing through the heat sink fin 3. Thus, the heat radiation capacity of this embodiment is further increased.

EMBODIMENT 8

Figure 9:
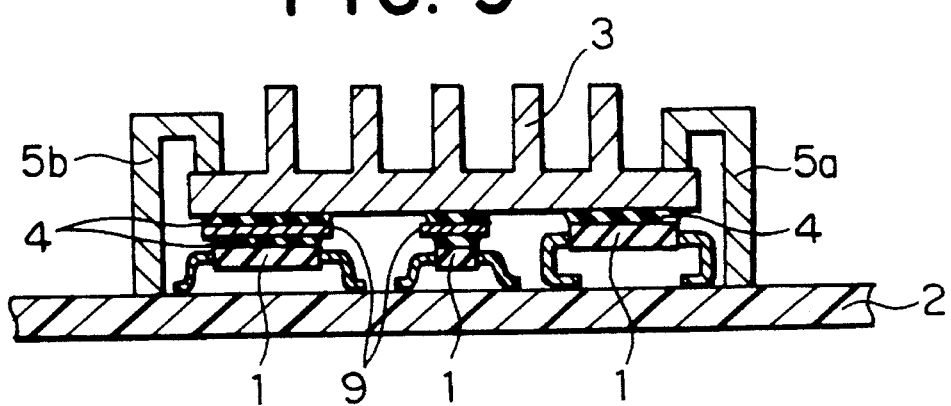
FIG. 9 is a cross-sectional view showing a semiconductor integrated circuit apparatus according to Embodiment 8 of the present invention.

FIG. 9 shows Embodiment 8 of the present invention. In the embodiment of FIG. 9, a heat sink fin 3 is bonded to a plurality of electronic parts 1, whose heights, i.e., thicknesses, are different from each other, through at least one spacer having good thermally-conductivity with thermally-conductive resin or thermally-conductive fats and fatty oils 4. Furthermore, two thermally-conductive materials 5a and 5b depressing the heat sink fin 3 are fixed to a board 2 with solder 6. That is, the size of the heat sink fin 3 is enlarged parallel to the board, the thermally-conductive resin or thermally-conductive fats and fatty oils 4 are applied to the upper face of the plurality of electronic parts 1 having different from each other and which are mounted on the board 2; and the heat sink fin 3 is bonded to the plurality of electronic parts 1.

In this manner, one heat sink fin 3 is commonly used to radiate heat from a plurality of electronic parts 1, it is possible to compensate for height difference of the plurality of electronic parts by adjusting the quantity of the thermally-conductive resin or thermally-conductive fats and fatty oils 4. However, if the height difference is large that, adjustment cannot compensate the difference in heights. For such cases, in this embodiment, spacers 9 are inserted between the heat sink fin 3 and the electronic parts 1 having comparatively low heights. Then, through these spacers and the thermally-conductive resin or thermally-conductive fats and fatty oils 4, the plurality of electronic parts 1 and the heat sink fin 3 are bonded. In this manner, owing to the spacers 9, it is to radiate heat from the plurality of electronic parts 1, having different heights from each other with one heat sink fin 3.

EMBODIMENT 9

Figure 10:
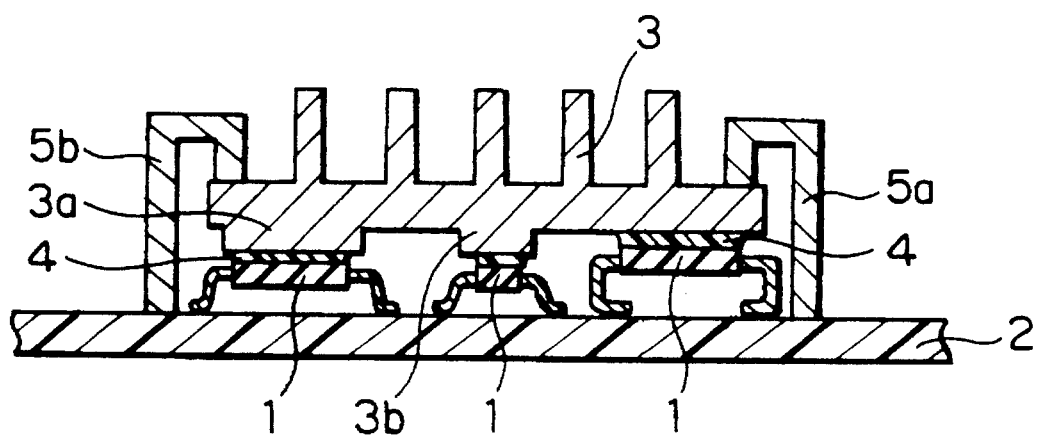
FIG. 10 is a cross-sectional view showing a semiconductor integrated circuit apparatus according to Embodiment 9 of the present invention.
Figure 11:
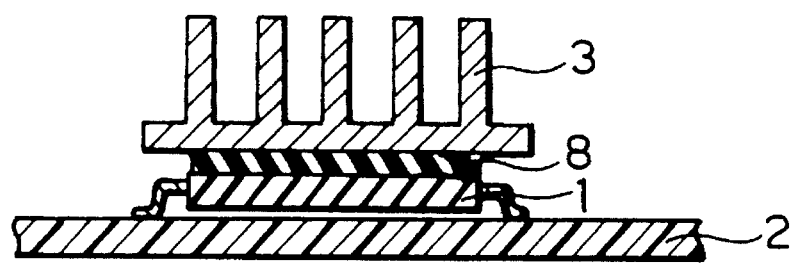
FIG. 11 is a cross-sectional view showing a conventional semiconductor integrated circuit apparatus.

FIG. 10 shows Embodiment 9 of the present invention. In the embodiment of FIG. 10, at least one heat sink fin 3 is bonded to a plurality of electronic parts 1 having different heights from each other, through thermally-conductive resin or thermally-conductive fats and fatty oils 4. Furthermore, two thermally-conductive clamps 5a and 5b urge the heat sink fin 3 and are fixed to a board 2 with solder 6. That is, in this embodiment, portions of the lower face of the heat sink fin 3 facing the electronic parts 1 whose heights are comparatively low protrude toward the electronic parts 1. In this manner, the convex portions 3a and 3b perform almost the same functions as the spacers in Embodiment 8. Therefore, according to this Embodiment 9 also, the same effects as those in Embodiment 8 can be obtained.

In a semiconductor integrated circuit apparatus having a cooling apparatus for electronic parts that is constituted as described above, the electronic parts and the cooling member are placed opposite to each other and thermally-connected through a thermally-conductive resin or thermally-conductive fats and fatty oils. Therefore, unlike a conventional example, the electronic parts and the cooling member are not fixed with an adhesive. Accordingly, the cooling member can be easily detached from the electronic parts, there is no possibility of breaking the electronic parts when exchanging or inspecting them, and reclamation of the electronic parts and the cooling member becomes possible. In addition, portions of the perimeter of the above-described cooling member are supported with the above-described thermally-conductive clamps materials respectively. Therefore, if the size of the cooling member is changed, this apparatus can accommodate the changes by changing soldered positions of the above-described thermally-conductive clamps materials on the board.

Further, by inserting elastic members between the above-described thermally-conductive clamps and the cooling member, if the size of the electronic parts in the direction perpendicular to the board is changed, the change can be absorbed by deformation of the elastic members.

Furthermore, by forming notches in the above-described thermally-conductive clamps so as to move the above-described cooling member parallel to the board, in case it becomes necessary to detach only the cooling member at the time of inspection or pattern revision of the board, it is possible to move only the cooling member through the notches for a detachment without melting the solder fixing the thermally-conductive clamps to the board.

Moreover, by soldering the above-described thermally-conductive clamps to thermal vias of the board, heat generated by the electronic parts is radiated not only from the cooling member but also from these thermal vias through the thermally-conductive clamp. Therefore, heat radiation capacity of the cooling apparatus can be further increased.

In addition, the above-described cooling member and a plurality of electronic parts, having heights different from each other are placed opposite to each other and spacers are inserted between comparatively low electronic parts and the cooling member. Thereby, this apparatus can sufficiently accommodate a plurality of electronic parts having heights significantly different from each other with one cooling member.

Further, the above-described cooling member and a plurality of electronic parts having heights different from each other are placed opposite to each other. In addition, portions of the lower face of this cooling member protrude toward the electronic parts. Owing to this formation, this apparatus can sufficiently accommodate the plurality of electronic parts which has significant different heights with one cooling member.

What is claimed is:

1. A semiconductor integrated circuit apparatus having:

a board and a plurality of electronic parts, such as semiconductor integrated circuit devices, mounted on said board;

a cooling member disposed opposite said electronic parts;

a thermally conductive material disposed between and contacting said electronic parts and said cooling member; and at least two thermally conductive clamps soldered to said board, clamping said cooling member at a periphery, and urging said cooling member against said thermally conductive material and toward said electronic parts wherein said board includes at least one thermal via and at least one of said clamps is soldered to said board at said at least one thermal via.

2. A semiconductor integrated circuit apparatus having:

a board and a plurality of electronic parts, such as semiconductor integrated circuit devices, mounted on said board;

a cooling member disposed opposite said electronic parts;

a thermally conductive material disposed between and contacting said electronic parts and said cooling member; and at least two thermally conductive clamps soldered to said board, clamping said cooling member at a periphery, and urging said cooling member against said thermally conductive material and toward said electronic parts wherein said electronic parts have different heights relative to said board and said cooling member includes protrusions protruding toward said electronic parts and providing continuous mechanical connections between said electronic parts and said cooling member through said thermally conductive material.

* * * * *